(12) United States Patent
Aoyama et al.

(10) Patent No.: US 12,342,459 B2
(45) Date of Patent: Jun. 24, 2025

(54) FLEXIBLE PRINTED WIRING BOARD AND ELECTRIC WIRING

(71) Applicant: MEKTEC CORPORATION, Tokyo (JP)

(72) Inventors: Shunsuke Aoyama, Tokyo (JP); Masanori Hirata, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 200 days.

(21) Appl. No.: 18/177,000

(22) Filed: Mar. 1, 2023

(65) Prior Publication Data

US 2023/0354522 A1 Nov. 2, 2023

(30) Foreign Application Priority Data

Apr. 27, 2022 (JP) ................................ 2022-073363

(51) Int. Cl.
| | |
|---|---|
| *H01R 12/61* | (2011.01) |
| *H01R 12/62* | (2011.01) |
| *H01R 12/63* | (2011.01) |
| *H05K 1/11* | (2006.01) |
| *H01R 35/02* | (2006.01) |

(52) U.S. Cl.
CPC .............. *H05K 1/118* (2013.01); *H01R 12/61* (2013.01); *H01R 12/62* (2013.01); *H01R 12/63* (2013.01); *H01R 35/025* (2013.01); *H05K 2201/09536* (2013.01); *H05K 2201/09609* (2013.01); *H05K 2201/09618* (2013.01); *H05K 2201/09672* (2013.01)

(58) Field of Classification Search
CPC ........ H05K 1/118; H05K 1/112; H05K 1/147; H05K 3/363; H05K 3/429; H05K 3/4614; H05K 3/4623; H05K 2201/09536; H05K 2201/09609; H05K 2201/09618; H05K 2201/09672; H01R 12/61; H01R 12/62; H01R 12/63; H01R 35/025
USPC ......................................................... 174/254
See application file for complete search history.

(56) References Cited

U.S. PATENT DOCUMENTS

| | | | | |
|---|---|---|---|---|
| 5,428,190 A | * | 6/1995 | Stopperan | ............... H05K 1/148 174/250 |
| 5,903,440 A | * | 5/1999 | Blazier | ................ H05K 3/0014 361/748 |
| 5,924,875 A | * | 7/1999 | Tighe | ..................... H01R 12/78 439/74 |

(Continued)

FOREIGN PATENT DOCUMENTS

| | | | |
|---|---|---|---|
| JP | 6636628 B2 | 1/2020 | |
| JP | 6975053 B2 | 12/2021 | |

*Primary Examiner* — Timothy J Thompson
*Assistant Examiner* — Michael F McAllister
(74) *Attorney, Agent, or Firm* — Studebaker Brackett PLLC

(57) ABSTRACT

Provided is a flexible printed wiring board including: a base film which is an insulating layer; a first conductor layer; a second conductor layer; and a through-hole, in which the first conductor layer is provided on one surface of the base film, the second conductor layer is provided on the other surface of the base film, and the through-hole is provided so as to penetrate the base film and electrically connect the first conductor layer and the second conductor layer to each other, and the second conductor layer has a solderable region.

8 Claims, 8 Drawing Sheets

(56) References Cited

U.S. PATENT DOCUMENTS

| | | | | |
|---|---|---|---|---|
| 6,028,365 | A * | 2/2000 | Akram | H05K 3/305 |
| | | | | 257/692 |
| 6,705,005 | B1 * | 3/2004 | Blazier | H05K 1/0278 |
| | | | | 29/830 |
| 11,882,653 | B2 * | 1/2024 | Ronay | H05K 3/303 |
| 2010/0305420 | A1 * | 12/2010 | Curry | G01N 27/3272 |
| | | | | 257/E29.166 |
| 2010/0326716 | A1 * | 12/2010 | Zhang | H05K 1/0251 |
| | | | | 174/262 |
| 2011/0111264 | A1 * | 5/2011 | Hanazono | H01M 8/0269 |
| | | | | 174/262 |
| 2013/0033827 | A1 * | 2/2013 | Das | H05K 3/462 |
| | | | | 361/752 |
| 2014/0017938 | A1 * | 1/2014 | Iwano | H01R 12/79 |
| | | | | 439/586 |
| 2014/0085856 | A1 * | 3/2014 | Shirao | H01P 3/003 |
| | | | | 174/254 |
| 2015/0015288 | A1 * | 1/2015 | Ma | G01R 1/06738 |
| | | | | 324/754.2 |
| 2018/0255639 | A1 * | 9/2018 | Bergman | D03D 1/0082 |
| 2020/0389980 | A1 * | 12/2020 | Karavakis | H05K 3/125 |
| 2021/0092832 | A1 * | 3/2021 | Tonaru | H05K 3/34 |
| 2021/0272891 | A1 * | 9/2021 | Ronay | H01L 21/56 |
| 2022/0377885 | A1 * | 11/2022 | Ronay | H05K 1/036 |

* cited by examiner

FLEXIBLE PRINTED WIRING BOARD AND ELECTRIC WIRING

CROSS-REFERENCE TO RELATED APPLICATION

This application claims priority from Japanese Patent Application No. 2022-073363 filed with the Japan Patent Office on Apr. 27, 2022, the entire content of which is hereby incorporated by reference.

BACKGROUND

1. Technical Field

The present disclosure relates to a flexible printed wiring board and an electric wiring.

2. Related Art

Various devices include wirings for electrically connecting electric components to each other. For example, a flexible printed wiring board (hereinafter referred to as an FPC) integrally including many wirings has been suitably used (see Japanese Patent No. 6975053 and Japanese Patent No. 6636628, for example). The wiring (conductor layer) included in the FPC is electrically connected to a wiring of a rigid substrate or a terminal attached to a tip end of an electric wiring. The wirings of the FPCs are sometimes electrically connected to each other. For example, in a case where a wiring of an FPC is arranged between a stator and a rotor in a steering column of an automobile, a long wiring is required. For this reason, multiple FPCs are sometimes connected to form an electric wiring. For electrically connecting a wiring of an FPC and, e.g., a wiring of a rigid substrate to each other, connection by soldering has been broadly employed.

An FPC according to the prior art will be described with reference to FIGS. 7A, 7B, and 8. FIGS. 7A and 7B are schematic views of the FPC according to the prior art. FIG. 7A is a partial plan view of the FPC, and FIG. 7B is a sectional view along an EE line of FIG. 7A. FIG. 8 is a schematic sectional view showing the state of electric connection between wirings of the FPCs.

An FPC 500 includes a base film 510 which is an insulating layer, a conductor layer 520 provided on a surface of the base film 510, and a cover film 530 which is an insulating layer provided on a surface on the opposite side of the conductor layer 520 from the base film 510. The cover film 530 is bonded, with an adhesive layer 540, to the conductor layer 520 and the base film 510. Note that metal foil, such as copper foil, provided on the base film 510 is etched into a desired wiring (circuit). This wiring is equivalent to the conductor layer 520. As shown in FIGS. 7A and 7B, part of the conductor layer 520 is exposed, and wirings or terminals of other members are electrically connected to such an exposed portion of the conductor layer 520 by soldering.

FIG. 8 shows the state of electric connection between the wirings of the FPCs. In the figure, the right FPC 500 and a left FPC 500A have the same basic configuration. For example, in a state in which solder S in a paste form is applied to the exposed portion of the conductor layer 520 of the right FPC 500, the exposed portion of the conductor layer 520 of the left FPC 500A is bonded. Subsequently, the bonded portion is heated with sandwiched from both sides by a first heating tool 610 and a second heating tool 620. For example, the first heating tool 610 is heated to 315° C., and the second heating tool 620 is heated to 400° C. Accordingly, the solder S in the paste form is melted, and thereafter, the first heating tool 610 and the second heating tool 620 are separated and the conductor layer 520 of the FPC 500 and the conductor layer 520 of the FPC 500A are electrically connected to each other via the solder S.

During the above-described soldering process, the solder S portion is at a high temperature. Heat generated during the soldering process is transmitted from the solder S in a direction of separating from the solder S portion particularly via the conductor layer 520 having a high thermal conductivity. For this reason, air bubbles are caused inside the adhesive layer 540 or part of the cover film 530 is detached, leading to quality degradation.

SUMMARY

A flexible printed wiring board according to an embodiment of the present disclosure is configured to include: a base film which is an insulating layer; a first conductor layer; a second conductor layer; and a through-hole, in which the first conductor layer is provided on one surface of the base film, the second conductor layer is provided on the other surface of the base film, and the through-hole is provided so as to penetrate the base film and electrically connect the first conductor layer and the second conductor layer to each other, and the second conductor layer has a solderable region.

DETAILED DESCRIPTION

Figure 1A:
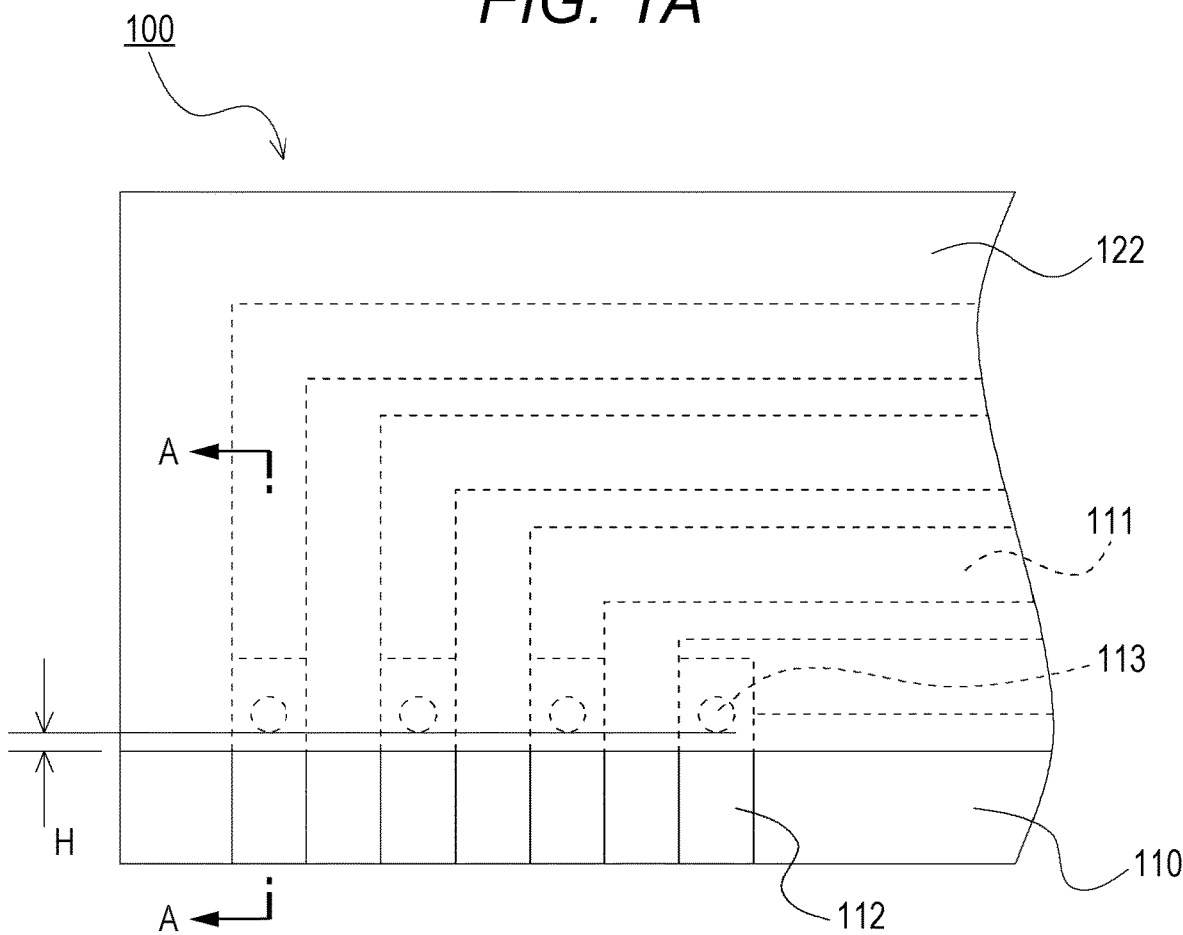
FIGS. 1A and 1B are schematic views of a flexible printed wiring board according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One object of the present disclosure is to provide a flexible printed wiring board and an electric wiring configured so that quality degradation due to soldering can be reduced.

The present disclosure employs the following technique in order to solve the above-described problem.

A flexible printed wiring board according to an aspect of the present disclosure includes: a base film which is an insulating layer; a first conductor layer; a second conductor layer; and a through-hole, in which the first conductor layer is provided on one surface of the base film, the second conductor layer is provided on the other surface of the base film, and the through-hole is provided so as to penetrate the base film and electrically connect the first conductor layer and the second conductor layer to each other, and the second conductor layer has a solderable region.

According to the present disclosure, in soldering, heat of the heated second conductor layer is transmitted to the first conductor layer via the through-hole, and therefore, the heat transmitted to the first conductor layer can be reduced.

It is preferred that a distance between an inner end portion of the solderable region in the flexible printed wiring board and an end portion of the through-hole closest to the end portion of the solderable region is 20 mm or less.

It is preferred that a width of a portion of the first conductor layer in a vicinity of a portion connected to the through-hole is partially narrower than those of other portions of the first conductor layer.

With this configuration, thermal conduction can be lowered at the narrow portion of the first conductor layer.

Further, an electric wiring according to the present disclosure includes a plurality of the flexible printed wiring boards described above, in which the second conductor layers of the flexible printed wiring boards are electrically connected to each other by soldering.

Note that the above-described configurations may be employed in combination to the extent possible.

As described above, according to the present disclosure, quality degradation due to soldering can be reduced.

Hereinafter, a mode for carrying out the present disclosure will be described in detail as an example with reference to the drawings based on an embodiment. Note that unless otherwise specified, the dimensions, materials, shapes, relative arrangement and the like of components described in this embodiment do not limit the scope of the disclosure.

EMBODIMENT

A flexible printed wiring board (hereinafter referred to as an FPC) according to the embodiment of the present disclosure will be described with reference to FIGS. 1A to 6B. Note that in a plan view described below, part of a main internal configuration is shown as a see-through portion and is indicated by a dashed line.

<Configuration of FPC>

Figure 1B:
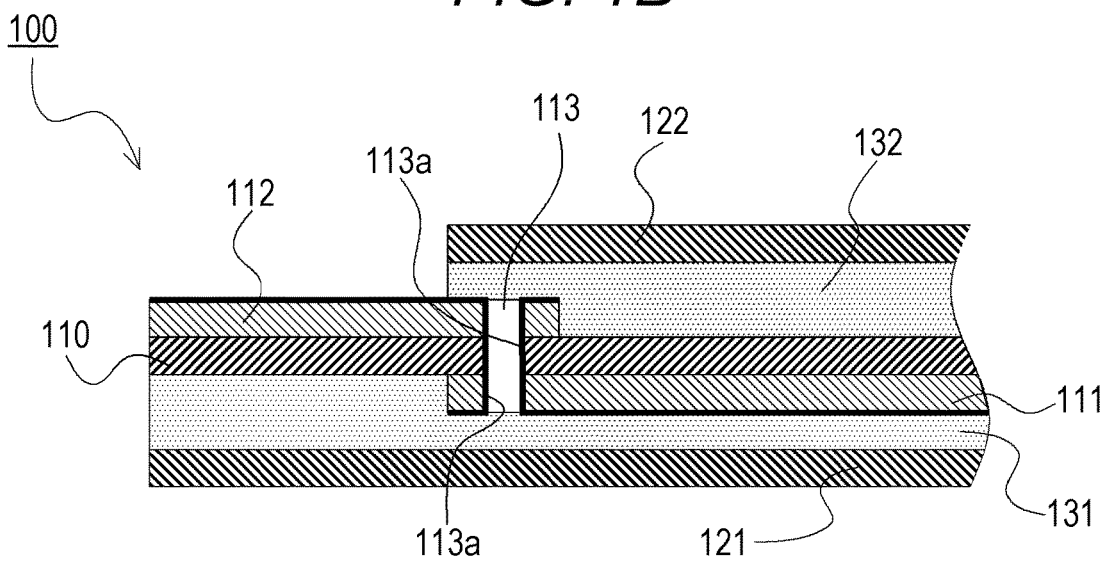

The configuration of an FPC 100 according to the present embodiment will be described with reference to FIGS. 1A and 1B. FIGS. 1A and 1B are schematic views of the FPC 100 according to the embodiment of the present disclosure. FIG. 1A is a partial plan view of the FPC 100, and FIG. 1B is a sectional view along an AA line of FIG. 1A.

The FPC 100 includes a base film 110 which is an insulating layer, a first conductor layer 111 provided on one surface of the base film 110, and a second conductor layer 112 provided on the other surface of the base film 110. As shown in FIG. 1B, in the present embodiment, the first conductor layer 111 is provided on the lower surface side of the base film 110, and the second conductor layer 112 is provided on the upper surface side (front surface side) of the base film 110. The first conductor layer 111 is utilized as a wiring, and the second conductor layer 112 is utilized as an electric connection portion.

A first cover film 121 which is an insulating layer is provided on the lower surface side of the base film 110. The first cover film 121 is bonded, with an adhesive layer 131, to the first conductor layer 111 and the base film 110. Note that metal foil, such as copper foil, provided on the base film 110 is etched into a desired wiring (circuit). This wiring is equivalent to the first conductor layer 111. As described above, the first conductor layer 111 is utilized as the wiring.

The FPC 100 according to the present embodiment further includes a through-hole 113 (via). The through-hole 113 is provided so as to penetrate the base film 110 and electrically connect the first conductor layer 111 and the second conductor layer 112 to each other. Moreover, in the FPC 100 according to the present embodiment, the second conductor layer 112 has a solderable region connectable to, e.g., wirings of other members by soldering. The solderable region is a region to be soldered, and can also be referred to as an expected soldering region.

As viewed from above, an end portion of the second conductor layer 112 is provided so as to overlap with an end portion of the first conductor layer 111, and in the description below, such an overlap portion will be sometimes referred to as an overlap portion. The second conductor layer 112 is not present inside the overlap portion in the FPC 100, and extends from the overlap portion toward the outside of the FPC 100.

The through-hole 113 is provided in the overlap portion of the second conductor layer 112 and the first conductor layer 111. An inner peripheral surface of the through-hole 113, a surface of the first conductor layer 111, and a surface of the second conductor layer 112 are applied with copper plating 113a, and therefore, are electrically connected to each other. In an example shown in FIG. 1B, the through-hole 113 is provided so as to penetrate the base film 110, the first conductor layer 111, and the second conductor layer 112, but the present disclosure is not limited to this example and the through-hole 113 may only be required to be provided so as to penetrate the base film 110 and electrically connect the first conductor layer 111 and the second conductor layer 112 to each other.

The FPC 100 according to the present embodiment may further include a second cover film 122 on the upper surface side of the base film 110. The second cover film 122 is an insulating layer provided on the opposite side of the base film 110 from the first cover film 121, and is bonded to part of the base film 110 and part of the second conductor layer 112 with an adhesive layer 132.

In the FPC 100 according to the present embodiment, a portion of the second conductor layer 112 covered with no second cover film 122 is exposed. A portion of the second conductor layer 112 covered with the second cover film 122 which is the insulating layer is not solderable. On the other hand, the exposed portion of the second conductor layer 112 covered with no second cover film 122 is solderable. That is, the entirety of the exposed portion (region) of the second conductor layer 112 is equivalent to the solderable region. A distance H between the solderable region and the through-hole 113 is preferably 20 mm or less. As shown in FIG. 1A, the distance H is a distance between an inner end portion of the solderable region in the FPC 100 and an end portion of the through-hole 113 closest to such an end portion of the solderable region.

Note that as the materials of the base film 110, the first cover film 121, and the second cover film 122, e.g., polyimide, polyethylene naphthalate, or polyethylene terephthalate may be applied.

Advantages of FPC According to Present Embodiment

According to the FPC 100 of the present embodiment, in soldering, heat of the heated second conductor layer 112 is transmitted to the first conductor layer 111 via the through-hole 113. Thermal resistance between the second conductor layer 112 and the first conductor layer 111 is the thermal resistance of the through-hole 113 and the thermal resistance of a portion of the base film 110 sandwiched between the first conductor layer 111 and the second conductor layer 112. The thermal resistances of the through-hole 113 and the base film 110 are greater than that of the conductor layer, and therefore, heat transfer can be reduced as compared to a case where heat is transmitted only via a conductor layer as in a typical case. Thus, the heat transmitted to the first conductor layer 111 can be reduced. In the present embodiment, the distance H between the solderable region and the through-hole 113 is 20 mm or less. Thus, the heat of the second conductor layer 112 is not transmitted to deep in the FPC 100, but is transmitted to the first conductor layer 111 via the through-hole 113. Thus, heat transfer can be reduced. With the above-described configuration, air bubbles in the adhesive layers 131, 132 and detachment of the first cover film 121 or the second cover film 122 can be reduced. Thus, quality degradation due to soldering can be reduced. Moreover, in soldering, a temperature does not need to be decreased, and therefore, soldering can be stably performed. Further, soldering can be performed with a typical facility by a typical production process, and a cost does not increase because special process and facility are not necessary.

APPLICATION EXAMPLES OF FPC 100

First Application Example

Figure 2A:
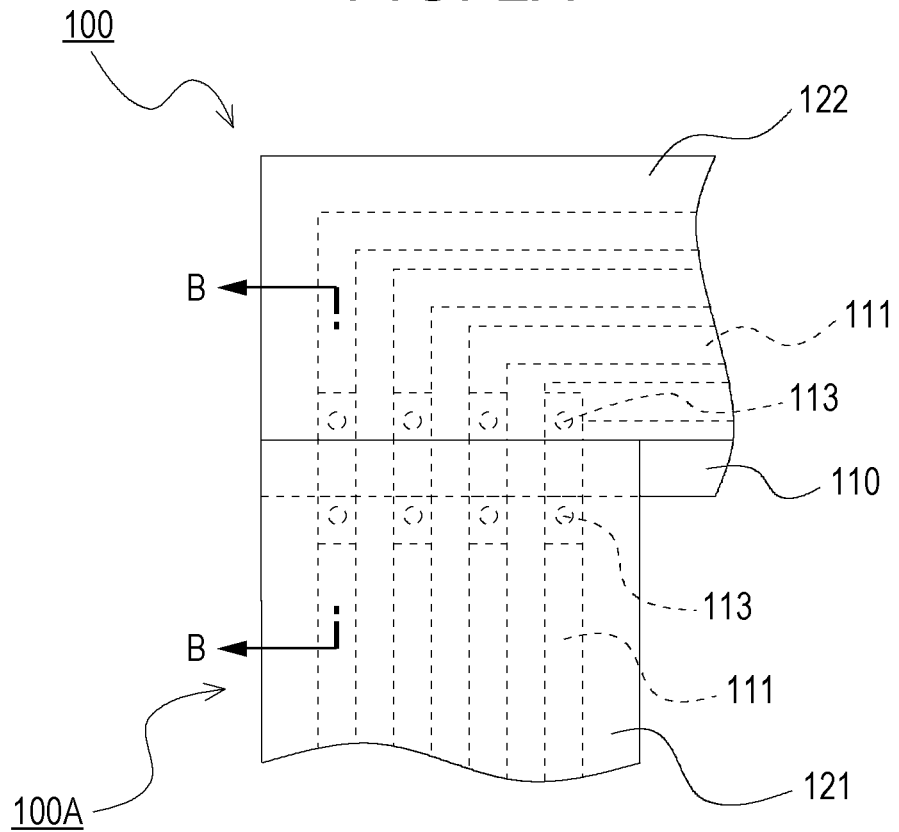
FIGS. 2A and 2B are schematic views of an electric wiring according to the embodiment of the present disclosure.
Figure 2B:
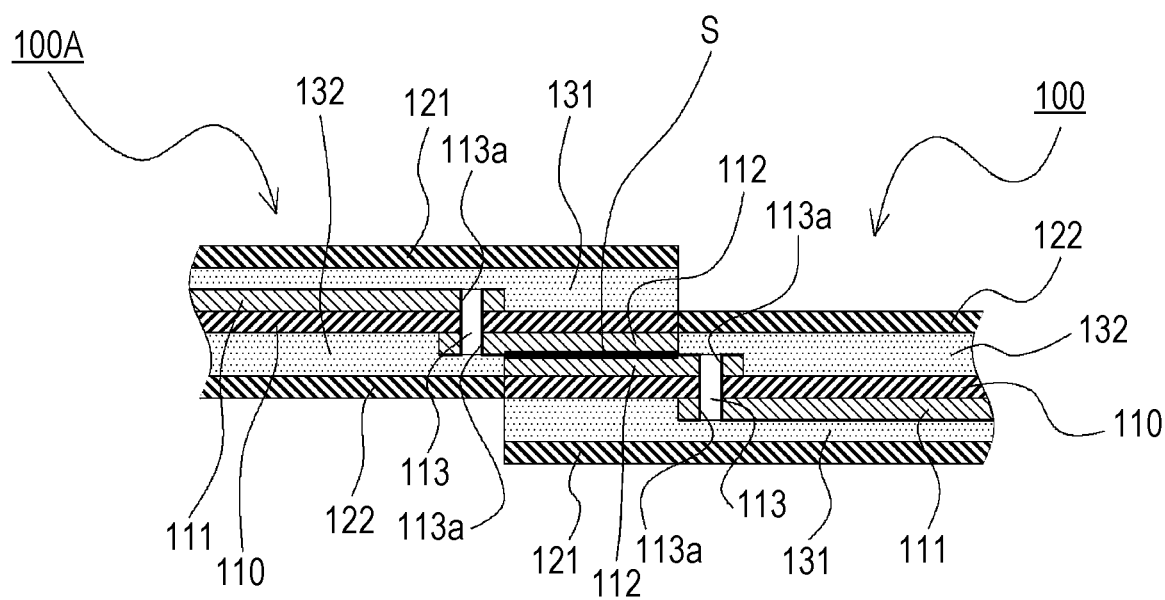

A first application example of the FPC 100 according to the present embodiment will be described with reference to FIGS. 2A, 2B, and 3. Here, a case where multiple FPCs 100 form an electric wiring will be described. FIGS. 2A and 2B are schematic views of the electric wiring according to the embodiment of the present disclosure.

Generally, in the case of requiring a long electric wiring, multiple FPCs 100 with a production limitation on a length are connected to each other, and in this manner, the long electric wiring can be obtained. That is, the multiple FPCs are connected to form the electric wiring according to the present embodiment. FIGS. 2A and 2B show the state of the vicinity of a connected portion of two FPCs 100, 100A. FIG. 2A is a plan view showing the state of the vicinity of the connected portion of the two FPCs 100, 100A, and FIG. 2B is a sectional view along a BB line of FIG. 2A. The configurations of the FPCs 100, 100A are as described above in the embodiment, and both the FPCs 100, 100A have the same basic configuration.

For example, in a state in which solder S in a paste form is applied to the exposed portion of the second conductor layer 112 of the FPC 100, the exposed portion of the second conductor layer 112 of the FPC 100A is bonded. Subsequently, the bonded portion is heated with sandwiched from both sides by two heating tools. Accordingly, the solder S in the paste form is melted, and thereafter, the two heating tools are separated and the second conductor layer 112 of the FPC 100 and the second conductor layer 112 of the FPC 100A are electrically connected to each other via the solder S. In this manner, the second conductor layers 112 are electrically connected to each other by soldering. As described above, in the present embodiment, heat is less likely to be transmitted to the first conductor layer 111 of each of the FPCs 100, 100A in soldering, and therefore, quality degradation is reduced.

Note that in FIGS. 2A and 2B, a case where the two FPCs 100, 100A are connected perpendicularly to each other is shown as an example, but the multiple FPCs may be linearly connected to form the long electric wiring.

Figure 3:
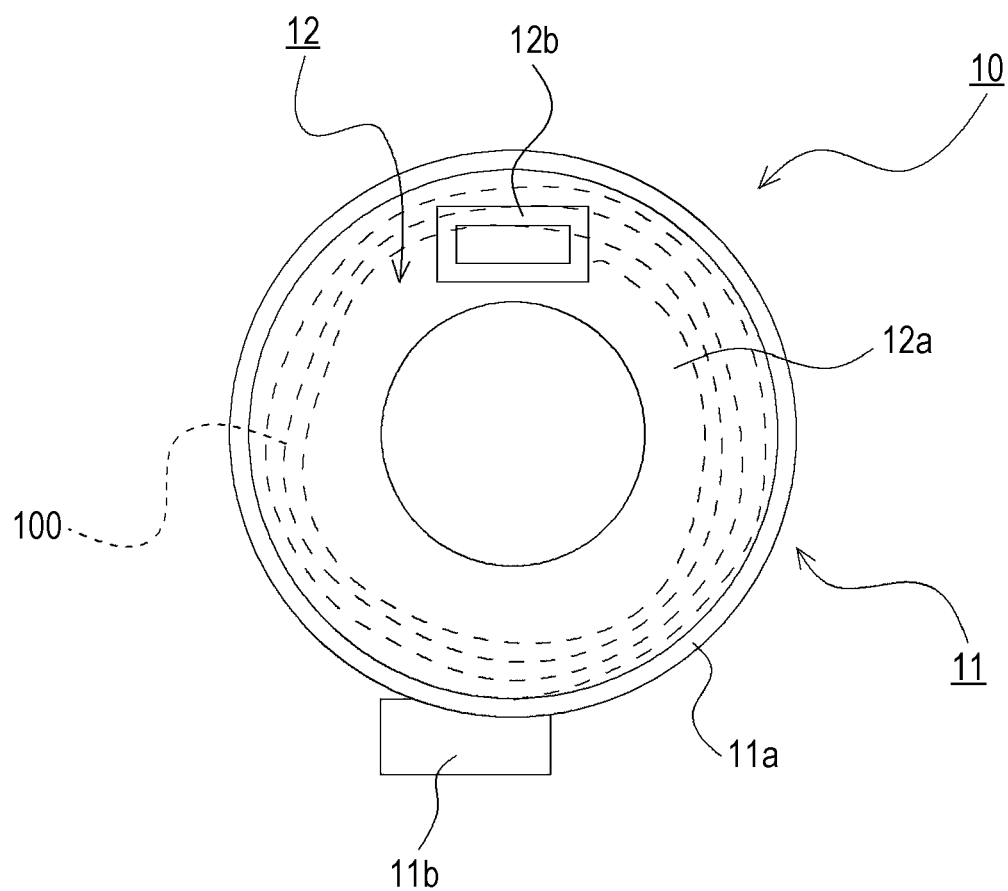
FIG. 3 is a schematic view showing a usage form of the flexible printed wiring board according to the embodiment of the present disclosure.

FIG. 3 shows a schematic configuration of a rotary connector 10 included in a steering column of an automobile. The rotary connector 10 includes a first case 11 and a second case 12 rotatably provided on the first case 11. The first case 11 integrally includes a case body portion 11a and a connector portion 11b. The second case 12 integrally includes a case body portion 12a and a connector portion 12b. The FPC 100 is included inside the first case 11 and the second case 12. Note that the FPC 100 is shown as a see-through portion and is indicated by a dashed line. The FPC 100 is connected to the connector portion 11b at one end, and is connected to the connector portion 12b at the other end. The FPC 100 is wound, for example, in a spiral shape with a sufficient clearance in the first case 11 and the second case 12, and therefore, does not interfere with rotation of the second case 12 relative to the first case 11. For the FPC used for the rotary connector 10 configured as described above, a long length is sometimes required. For this reason, the multiple FPCs are connected as described above, and in this manner, the long electric wiring can be obtained.

Second Application Example

Figure 4A:
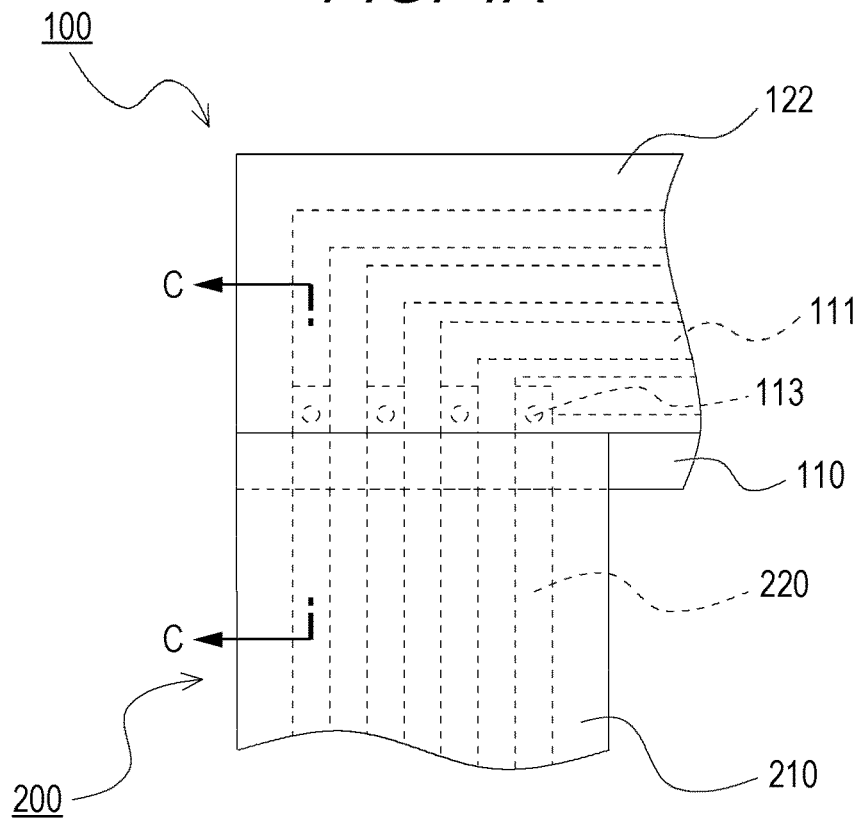
FIGS. 4A and 4B are schematic views showing a use example of the flexible printed wiring board according to the embodiment of the present disclosure.
Figure 4B:
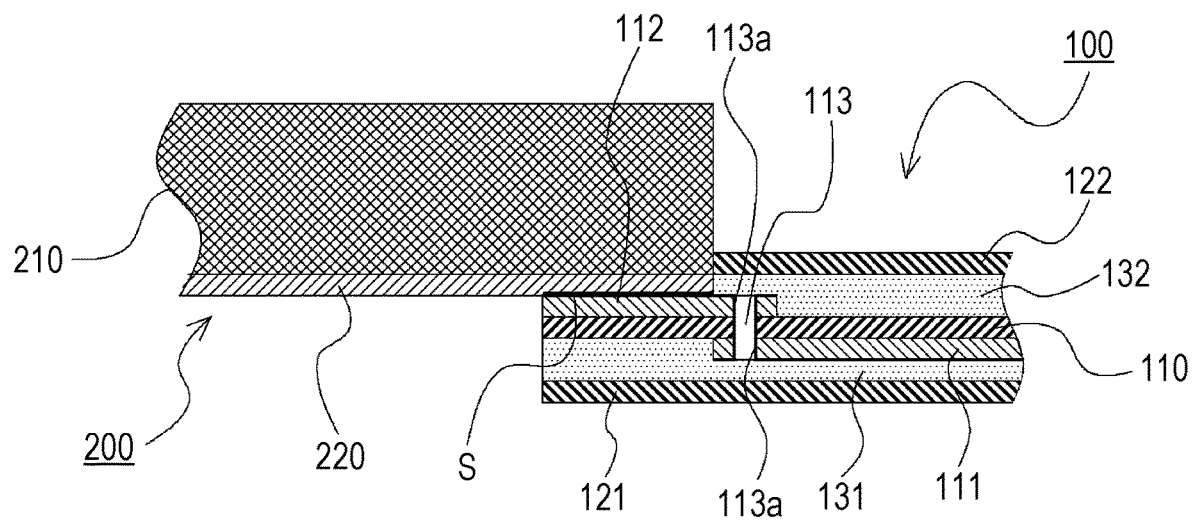

A second application example of the FPC 100 according to the present embodiment will be described with reference to FIGS. 4A and 4B. Here, a case where the FPC 100 and a rigid substrate are connected to each other will be described. FIGS. 4A and 4B are schematic views showing a use example of the FPC according to the embodiment of the present disclosure.

The FPC 100 is sometimes connected to a rigid substrate 200. FIGS. 4A and 4B show the state of the vicinity of a connected portion of the FPC 100 and the rigid substrate 200. FIG. 4A is a plan view showing the state of the vicinity of the connected portion of the FPC 100 and the rigid substrate 200, and FIG. 4B is a sectional view along a CC line of FIG. 4A. The configuration of the FPC 100 is as described above in the embodiment.

The rigid substrate 200 includes a substrate body 210 and a wiring 220 provided on a surface of the substrate body 210. For example, in a state in which solder S in a paste form is applied to the exposed portion of the second conductor layer 112 of the FPC 100, part of the wiring 220 of the rigid substrate 200 is bonded. Subsequently, the bonded portion is heated with sandwiched from both sides by two heating tools. In this manner, the solder S in the paste form is melted, and thereafter, the two heating tools are separated and the second conductor layer 112 of the FPC 100 and the wiring 220 of the rigid substrate 200 are electrically connected to each other via the solder S. As described above, in the present embodiment, heat is less likely to be transmitted to the first conductor layer 111 of the FPC 100 in soldering, and therefore, quality degradation is reduced.

Third Application Example

Figure 5A:
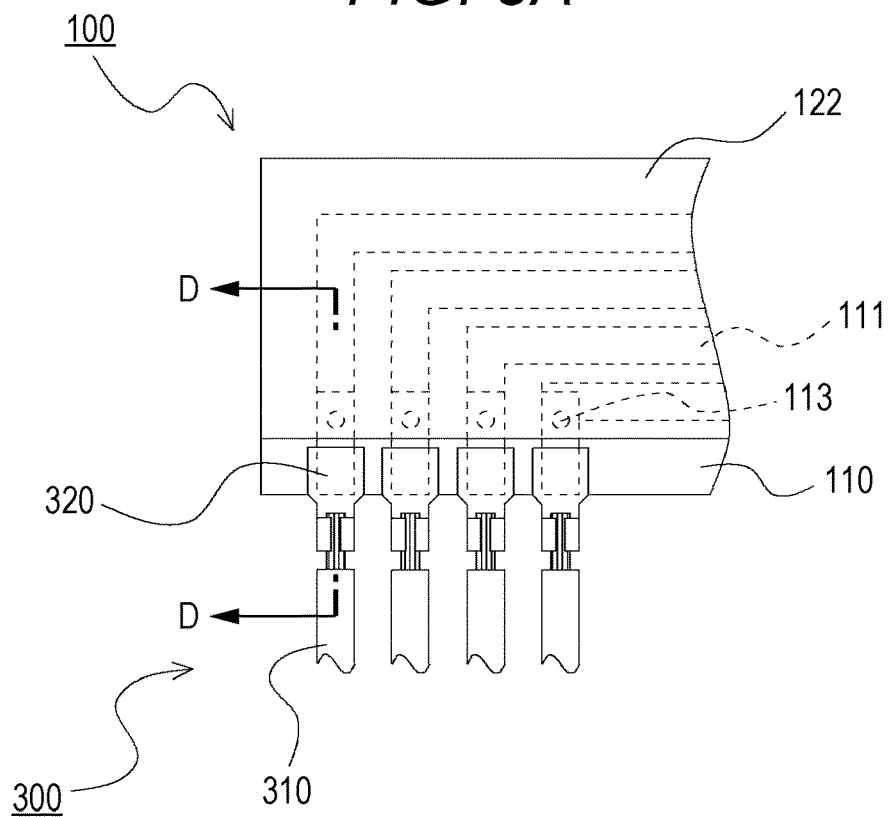
FIGS. 5A and 5B are schematic views showing a use example of the flexible printed wiring board according to the embodiment of the present disclosure.
Figure 5B:
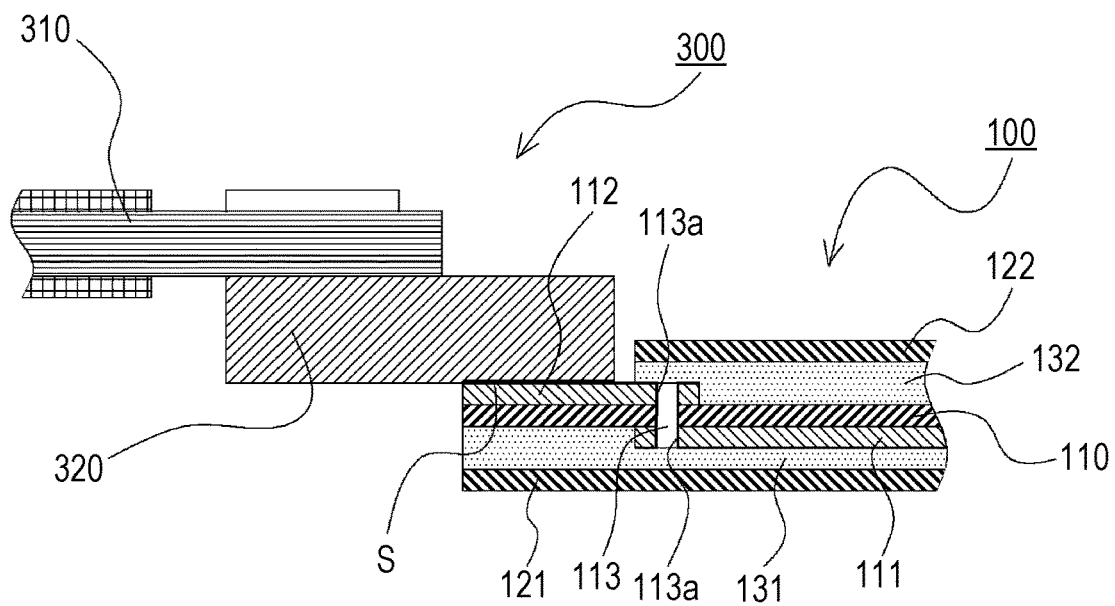

A third application example of the FPC 100 according to the present embodiment will be described with reference to FIGS. 5A and 5B. Here, a case where the FPC 100 and a terminal-equipped electric wiring are connected to each other will be described. FIGS. 5A and 5B are schematic views showing a use example of the FPC according to the embodiment of the present disclosure.

The FPC 100 is sometimes connected to the terminal-equipped electric wiring. FIGS. 5A and 5B show the state of the vicinity of a connected portion of the FPC 100 and a terminal-equipped electric wiring 300. FIG. 5A is a plan view showing the state of the vicinity of the connected portion of the FPC 100 and the terminal-equipped electric wiring 300, and FIG. 5B is a sectional view along a DD line of FIG. 5A. The configuration of the FPC 100 is as described above in the embodiment.

The terminal-equipped electric wiring 300 includes electric wirings 310 and terminals 320 attached to tip ends of the electric wirings 310. For example, in a state in which solder S in a paste form is applied to the exposed portion of the second conductor layer 112 of the FPC 100, part of the terminals 320 is bonded. Subsequently, the bonded portion is heated with sandwiched from both sides by two heating tools. In this manner, the solder S in the paste form is melted, and thereafter, the two heating tools are separated and the second conductor layer 112 of the FPC 100 and the terminals 320 are electrically connected to each other via the solder S. As described above, in the present embodiment, heat is less likely to be transmitted to the first conductor layer 111 of the FPC 100 in soldering, and therefore, quality degradation is reduced.

Modifications of FPC

Figure 6A:
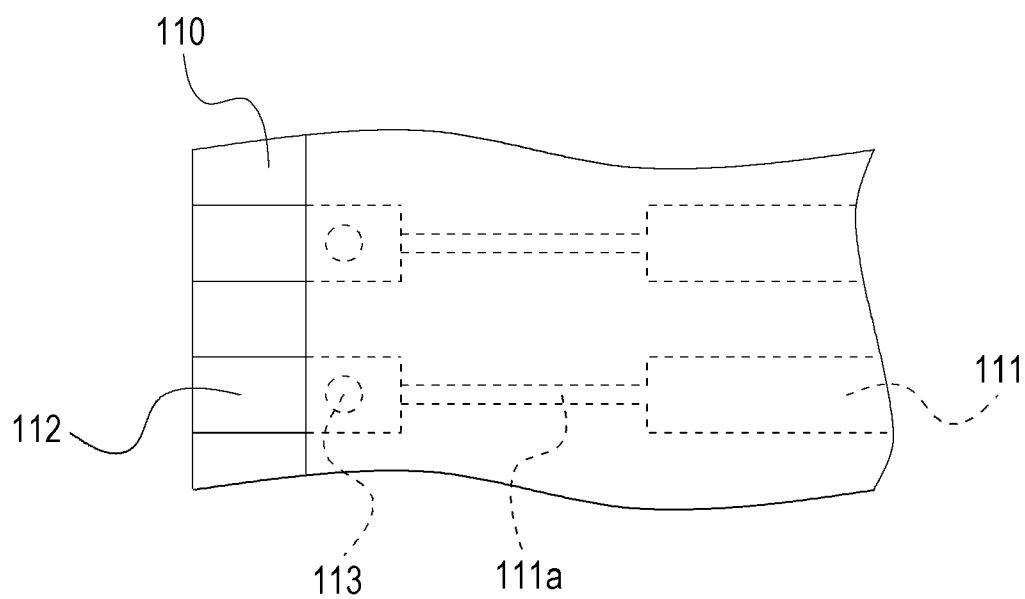
FIGS. 6A and 6B are schematic views showing a modification of the flexible printed wiring board according to the embodiment of the present disclosure.
Figure 6B:
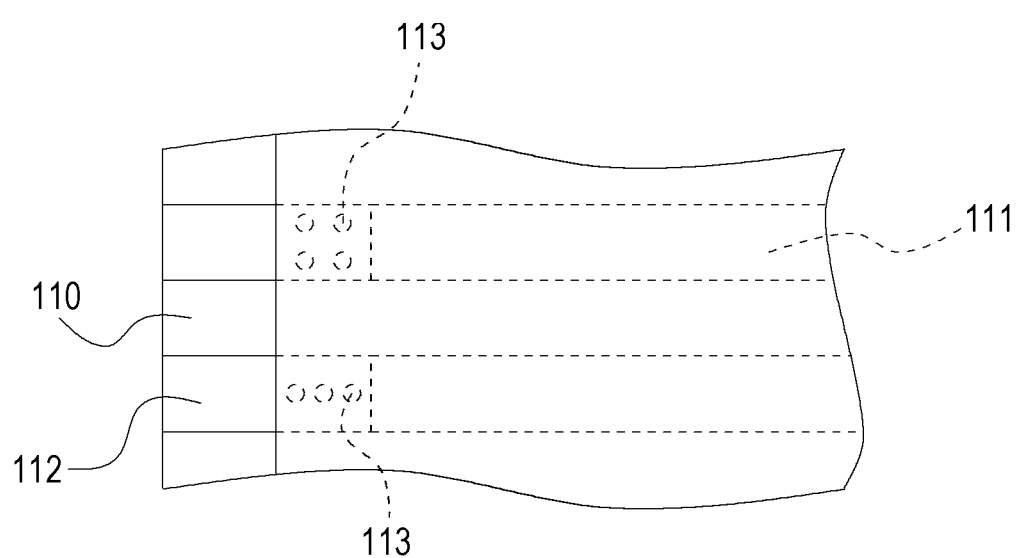
Figure 7A:
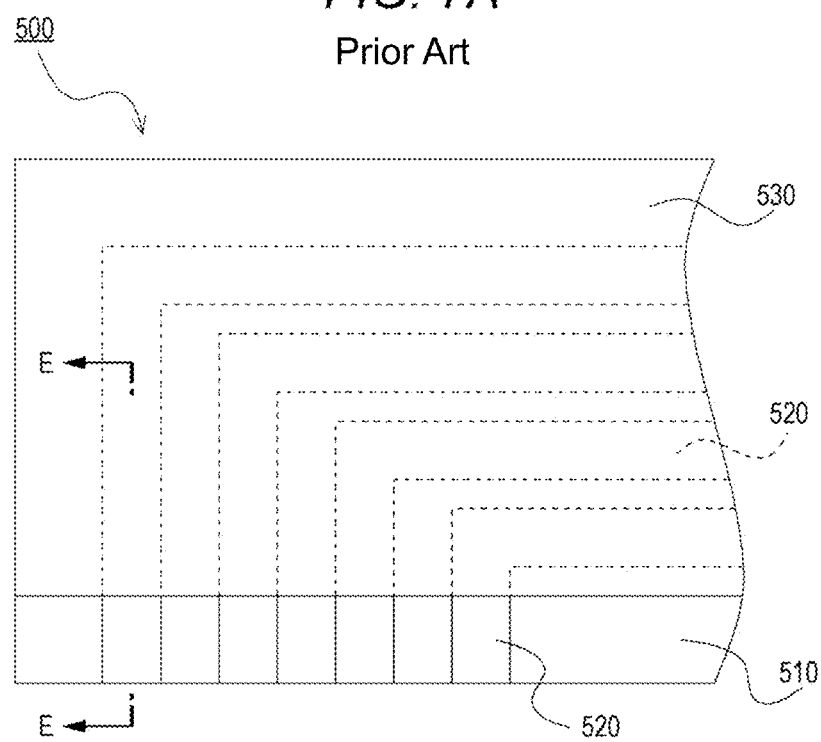
FIGS. 7A and 7B are schematic views of a flexible printed wiring board according to the prior art.
Figure 7B:
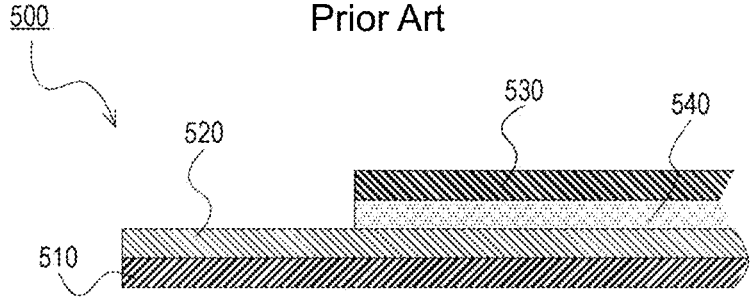
Figure 8:
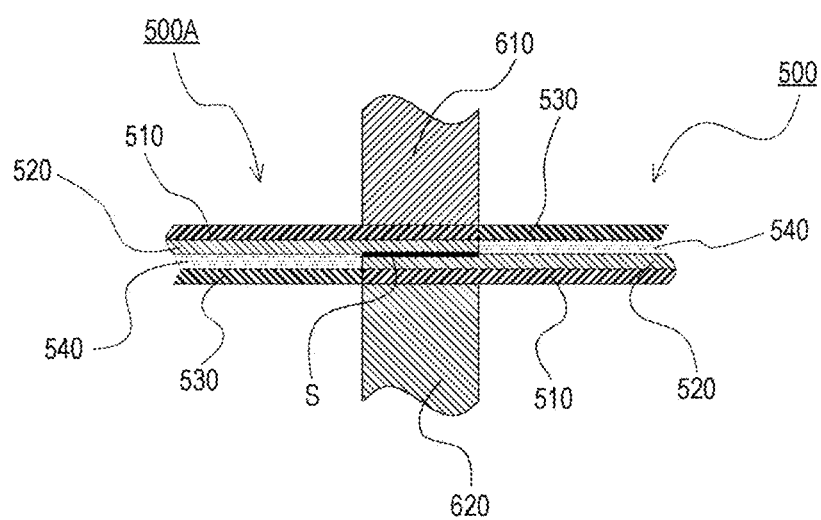
FIG. 8 is a schematic sectional view showing the state of electric connection between flexible printed wiring boards according to the prior art.

A modification of the FPC will be described with reference to FIGS. 6A and 6B. FIGS. 6A and 6B are schematic views showing the modification of the FPC according to the embodiment of the present disclosure. FIGS. 6A and 6B show partial plan views of the FPC.

As shown in FIG. 6A, a configuration may be employed, in which a thin wiring portion 111a which is a partially-narrow portion of the first conductor layer 111 in the vicinity of a portion connected to the through-hole 113 is provided. With this configuration, the thin wiring portion 111a of the first conductor layer 111 has a higher thermal resistance than those of other portions of the first conductor layer 111, and therefore, the heat of the second conductor layer 112 is less likely to be transmitted at the thin wiring portion 111a. Thus, quality degradation can be further reduced.

In order to enhance reliability in electric connection, a configuration in which the first conductor layer 111 and the second conductor layer 112 are electrically connected to each other via multiple through-holes 113 may be employed as shown in FIG. 6B. Note that in the case of employing this configuration, the distance H between the solderable region and the through-hole 113 closest to the solderable region may be at least 20 mm or less. Needless to say, the distance H is preferably 20 mm or less. Also, in the case of employing the configuration with the multiple through-holes 113, the configuration of the thin wiring portion 111a as shown in FIG. 6A may be employed.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed wiring board comprising:
a base film which is an insulating layer;
a first conductor layer;
a second conductor layer; and
a through-hole,
wherein the first conductor layer is provided on one surface of the base film, the second conductor layer is provided on the other surface of the base film, and
the through-hole is provided so as to penetrate the first conductor layer, the base film, and the second conductor layer,
a metal plating is continuously disposed on an inner peripheral surface of the through-hole, a horizontal surface of the first conductor layer opposite to the base film side, and a horizontal surface of the second conductor layer opposite to the base film side,
the first conductor layer and the second conductor layer are electrically connected by the metal plating disposed on the inner peripheral surface of the through-hole, and
the second conductor layer has a solderable region.

2. The flexible printed wiring board according to claim 1, wherein
a distance between an inner end portion of the solderable region in the flexible printed wiring board and an end portion of the through-hole closest to the end portion of the solderable region is 20 mm or less.

3. The flexible printed wiring board according to claim 1, wherein
a width of a portion of the first conductor layer in a vicinity of a portion connected to the through-hole is partially narrower than those of other portions of the first conductor layer.

4. An electric wiring comprising:
a plurality of the flexible printed wiring boards according to claim 1,
wherein the second conductor layers of the flexible printed wiring boards are electrically connected to each other by soldering.

5. An electric wiring comprising:
a plurality of the flexible printed wiring boards according to claim 2,
wherein the second conductor layers of the flexible printed wiring boards are electrically connected to each other by soldering.

6. An electric wiring comprising:
a plurality of the flexible printed wiring boards according to claim 3,
wherein the second conductor layers of the flexible printed wiring boards are electrically connected to each other by soldering.

7. The flexible printed wiring board according to claim 1, the flexible printed wiring board further comprising:
a first adhesive layer; and a second adhesive layer, wherein the first adhesive layer is provided on the metal plating formed on the first conductor layer and is provided so as to cover an opening of the through-hole on a side with the first conductor layer, the second adhesive layer is provided on the metal plating formed on the second conductor layer in a region other than the solderable region and is provided so as to cover an opening of the through-hole on a side with second conductor layer, and the through-hole extends from a surface of the first adhesive layer on the side of the first conductor layer to a surface of the second adhesive layer on the side of the second conductor layer when viewed in cross-section.

8. The flexible printed wiring board according to claim 7, the flexible printed wiring board further comprising:

a first cover layer; and a second cover layer, wherein the first cover layer is provided on the first adhesive layer, the second cover layer is provided on the second adhesive layer.

* * * * *